(12) United States Patent
Kim et al.

(10) Patent No.: US 8,969,188 B2
(45) Date of Patent: *Mar. 3, 2015

(54) METHODS OF FABRICATING SEMICONDUCTOR DEVICES

(75) Inventors: Ki-chul Kim, Gyeonggi-do (KR);
Jong-cheol Lee, Seoul (KR);
Heung-ahn Kwon, Gyeonggi-do (KR);
Hyun-wook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 600 days.

This patent is subject to a terminal disclaimer.

(21) Appl. No.: 13/326,700

(22) Filed: Dec. 15, 2011

(65) Prior Publication Data

US 2012/0088360 A1    Apr. 12, 2012

Related U.S. Application Data

(63) Continuation-in-part of application No. 12/238,822, filed on Sep. 26, 2008, now Pat. No. 8,159,012, and a continuation-in-part of application No. 13/019,636, filed on Feb. 2, 2011, now Pat. No. 8,399,364.

(30) Foreign Application Priority Data

Dec. 16, 2010    (KR) .................. 10-2010-0129309

(51) Int. Cl.
*H01L 21/44*    (2006.01)
*H01L 21/4763*    (2006.01)
*H01L 21/28*    (2006.01)
*H01L 27/108*    (2006.01)
*H01L 49/02*    (2006.01)
*H01L 29/423*    (2006.01)
*H01L 29/51*    (2006.01)

(52) U.S. Cl.
CPC .... *H01L 21/28273* (2013.01); *H01L 21/28282* (2013.01); *H01L 27/10852* (2013.01); *H01L 28/65* (2013.01); *H01L 29/42324* (2013.01); *H01L 29/4234* (2013.01); *H01L 29/51* (2013.01); *H01L 29/513* (2013.01)
USPC ............ 438/592; 438/785; 257/E21.19

(58) Field of Classification Search
CPC ............ H01L 21/28273; H01L 21/28282; H01L 27/10852; H01L 29/513
USPC ........................................... 438/592, 785
See application file for complete search history.

(56) References Cited

U.S. PATENT DOCUMENTS 8,159,012 B2    4/2012    Lee et al.
2005/0145918 A1    7/2005    Gealy et al.
(Continued)

FOREIGN PATENT DOCUMENTS

JP    2005-079223    3/2005
KR    100716654 B1    5/2007
(Continued)

*Primary Examiner* — Alexander Ghyka
(74) *Attorney, Agent, or Firm* — Myers Bigel Sibley & Sajvoec, P.A.

(57) ABSTRACT

Methods of manufacturing a semiconductor device including a multi-layer of dielectric layers may include forming a metal oxide layer on a semiconductor substrate and forming a multi-layer of silicate layers including metal atoms and silicon atoms, on the metal oxide layer. The multi-layer of silicate layers may include at least two metallic silicate layers having different silicon concentrations, which are a ratio of silicon atoms among all metal atoms and silicon atoms included in the metallic silicate layer.

18 Claims, 7 Drawing Sheets

(56) References Cited

U.S. PATENT DOCUMENTS

2005/0152094 A1 7/2005 Jeong et al.
2006/0264067 A1* 11/2006 Kher et al. .................. 438/785
2008/0020593 A1 1/2008 Wang et al.
2008/0164582 A1* 7/2008 Govindarajan ............... 257/635

FOREIGN PATENT DOCUMENTS

| KR | 100716655 B1 | 5/2007 |
| KR | 1020070111640 A | 11/2007 |
| KR | 1020080061486 | 7/2008 |
| KR | 1020090032971 | 4/2009 |

* cited by examiner

METHODS OF FABRICATING SEMICONDUCTOR DEVICES

CROSS-REFERENCE TO RELATED APPLICATIONS

This application claims the benefit of Korean Patent Application No. 10-2010-0129309, filed on Dec., 16, 2010, in the Korean Intellectual Property Office, and is a Continuation-In-Part of U.S. patent application Ser. No. 12/238,822, filed on Sep. 26, 2008, now U.S. Pat. No. 8,159,012 and Ser. No. 13/019,636, filed on Feb. 2, 2011, now U.S. Pat. No. 8,399,364 in U.S. Patent and Trademark Office, the disclosures of which are incorporated herein in their entirety by reference.

BACKGROUND

The inventive concept relates to methods of manufacturing semiconductor devices, and more particularly, to methods of manufacturing semiconductor devices including a multi-layer of dielectric layers.

Development of the semiconductor industry and user demand have led to highly integrated and high-performance electronic devices. Correspondingly, the demand for highly integrated and high-performance semiconductor devices, which are key components of electronic devices, is also increasing. In particular, conventional materials for use in an insulating layer included in a semiconductor device do not satisfy desired dielectric characteristics or insulating characteristics.

SUMMARY

The inventive concept provides methods of manufacturing semiconductor devices including a multi-layer of dielectric layers.

According to some embodiments of the inventive concept, there are provided methods of manufacturing semiconductor devices. Such methods may include forming a multi-layer of dielectric layers on a semiconductor substrate, the multi-layer of dielectric layers including at least two metallic silicate layers having different silicon concentrations, which are a ratio of silicon atoms among all metal atoms and silicon atoms included in the metallic silicate layer. In some embodiments, forming the multi-layer of dielectric layers includes forming a metal oxide layer on the semiconductor substrate and forming a multi-layer of silicate layers on the metal oxide layer, the multi-layer of silicate layers including metal atoms and silicon atoms.

Some embodiments provide that forming the multi-layer of silicate layers includes forming a first metallic silicate layer having a first silicon concentration and forming a second metallic silicate layer having a second silicon concentration that is higher than the first silicon concentration. In some embodiments, the first metallic silicate layer and the second metallic silicate layer each comprise a hafnium-zirconium silicate. Some embodiments provide that forming the multi-layer of silicate layers includes forming at least two first metallic silicate layers that the second metallic silicate layer is disposed between the at least two first metallic silicate layers.

In some embodiments, forming the multi-layer of silicate layers comprises forming at least two second metallic silicate layers and the first metallic silicate layer is disposed between the at least two second metallic silicate layers. Some embodiments provide that forming the multi-layer of silicate layers includes forming the first metallic silicate layer to have a first thickness and forming the second metallic silicate layer to have a second thickness that is smaller than the first thickness.

In some embodiments, forming the multi-layer of silicate layers includes forming the first metallic silicate layer to have a first thickness and forming the second metallic silicate layer to have a second thickness. Forming the metal oxide layer may include forming the metal oxide layer to have a third thickness that is smaller than the first thickness, the second thickness and/or a sum of the first thickness and the second thickness.

Some embodiments provide that, after forming the multi-layer of silicate layers, an upper electrode layer is formed on the multi-layer of silicate layers. In some embodiments, while forming the upper electrode layer, the multi-layer of silicate layers is crystallized to have a cubic system, tetragonal system, or orthorhombic system crystalline structure. Some embodiments provide that the multi-layer of silicate layers is crystallized at a temperature at which the upper electrode layer is formed.

Some embodiments include applying a process temperature that forms the upper electrode and that crystallizes the multi-layer of silicate layers to have a cubic system, tetragonal system, or orthorhombic system crystalline structure. Some embodiments provide that the process temperature crystallizes the metal oxide layer. In some embodiments, while forming the upper electrode layer, the metal oxide layer is crystallized at a temperature at which the second electrode layer is formed.

Some embodiments provide that the metal oxide layer includes a zirconium oxide, a hafnium oxide, and/or a hafnium-zirconium oxide. In some embodiments, the multi-layer of silicate layers includes a hafnium silicate, a zirconium silicate, and/or a hafnium-zirconium silicate.

Some embodiments of the inventive concept include methods of manufacturing a semiconductor device. Such methods may include forming a metal oxide layer on a semiconductor substrate, forming a first hafnium-zirconium silicate layer on the hafnium-zirconium oxide layer, forming a second hafnium-zirconium silicate layer having a higher silicon concentration than that of the first hafnium-zirconium silicate layer, on the first hafnium-zirconium oxide layer, and forming an upper electrode layer on the second hafnium-zirconium silicate layer. Some embodiments provide that the hafnium-zirconium oxide layer, the first hafnium-zirconium silicate layer, and the second hafnium-zirconium silicate layer are crystallized at a process temperature at which the upper electrode layer is formed.

In some embodiments, the metal oxide layer includes a hafnium-zirconium oxide layer. Some embodiments provide that the process temperature is in a temperature range of about 400° C. to about 750° C.

It is noted that aspects of the inventive concept described with respect to one embodiment may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

The present invention now will be described more fully hereinafter with reference to the accompanying drawings, in which embodiments of the inventive concept are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present inventive concept will now be described more fully hereinafter with reference to the accompanying drawings, in which some embodiments thereof are shown. This inventive concept, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventive concepts is provided.

Reference numerals are indicated in detail in some embodiments and their examples are represented in reference drawings. Throughout the drawings, like reference numerals are used for referring to the same or similar elements in the description and drawings.

Figure 1:
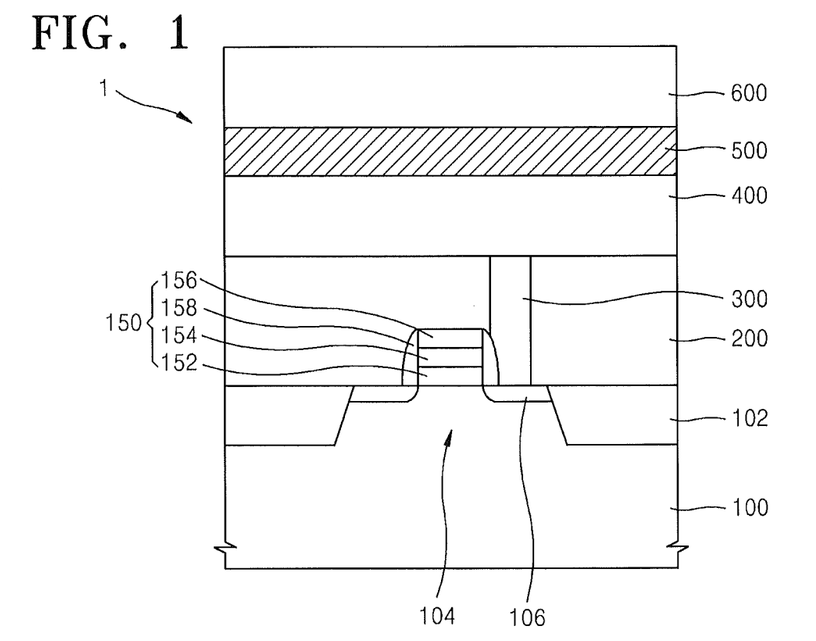
FIGS. 1 through 4 are cross-sectional views of aspects of a semiconductor device including a multi-layer of dielectric layers according to some embodiments of the inventive concept.

FIG. 1 is a cross-sectional view of an aspect of a semiconductor device 1 including a multi-layer of dielectric layers 500 manufactured according to an embodiment of the inventive concept.

Referring to FIG. 1, the semiconductor device 1 includes a multi-layer of dielectric layers 500 that is formed on a semiconductor substrate 10 and used as a capacitor dielectric layer. The semiconductor substrate may be, for example, a typical semiconductor substrate having a flat upper surface, such as a silicon substrate. Also, the semiconductor substrate 100 may be formed of a compound semiconductor substrate such as a silicon on insulator (SOI) substrate, a silicon-germanium substrate, or a gallium-arsenic substrate.

An impurity implantation region (not shown) such as wells may be formed in the semiconductor substrate 100, which may be used to form a semiconductor device such as a transistor, and a device isolation layer 102 may be disposed in the semiconductor substrate 100. The device isolation layer 102 may be formed by filling a trench (not shown) formed in the semiconductor substrate 100 with an insulating material by using a photolithography process. The device isolation layer 102 may be formed by forming an insulation material layer (not shown) so as to completely fill the trench, on the semiconductor substrate 100 in which the trench is formed, and then leaving only a portion of the insulation material layer formed inside the trench using a planarization process. The device isolation layer 102 may be formed of an oxide, a nitride, or a combination of these. The device isolation layer 102 may be a multi-layer of complex layers formed of a buffer oxide layer, a trench liner nitride layer, and a buried oxide layer.

An active region 104 that is isolated by the device isolation layer 102 may be formed on the semiconductor substrate 100. That is, the active region 104 may be a portion of the semiconductor substrate 100 that is defined by the device isolation layer 102. The active region 104 may be a portion of the semiconductor substrate 100 on the virtual plane that extends along a lowermost portion of the device isolation layer 102.

Source and drain regions 106 may be formed in a portion of the active region 104 by implanting conductive impurities. A gate structure 150 including a gate insulation layer 152 and a gate line 154 may be formed on the active region 104 to constitute a transistor.

Also, a bit line (not shown) may be further formed inside or on the semiconductor substrate 100. Also, an interlayer insulation layer 200 including a contact plug 300 which is connected to the transistor via the active region 104 may be formed.

The interlayer insulating layer 200 may be a homogenous material layer, or a heterogeneous material layer obtained by performing deposition two or more times. For example, the interlayer insulating layer 200 may include an insulating layer for separating the gate lines 154, an insulating layer for separating the bit lines, an insulating layer for separating the gate lines 154 from the bit lines, and an insulating layer covering the bit lines. In addition, each of the insulating layers may also be a homogenous material layer, or a heterogeneous material layer obtained by performing deposition two or more times. The interlayer insulating layer 200 may include, for example, a silicon oxide or a silicon nitride.

The contact plug 300 may be formed after the interlayer insulating layer 200 is etched to expose the active region 104, in particular, the source or drain regions 106. The contact plug 300 may be formed by depositing doped polysilicon, metal, metallic silicide, or metallic nitride. Some embodiments provide that the contact plug 300 may be formed using only doped polysilicon. However, if the interlayer insulating layer 200 is a heterogeneous material layer, many processes may be used to form the interlayer insulating layer 200. For example, the interlayer insulating layer 200 may be formed using the following two processes: a portion of the insulating layer for separating the gate lines 154 is etched to form a landing pad connected to the transistor through the active region 104, in particular, through the source or drain region 106; and a portion of the insulating layer for separating the bit lines and a portion of the insulating layer for separating the gate lines 154 from the bit lines are etched to form a buried plug connected to the landing pad. Each of the landing pad and the buried plug may be formed by depositing doped polysilicon, metal, metallic silicide, or metallic nitride. In some embodiments, each of the landing pad and the buried plug may be formed using only doped polysilicon. In addition, if necessary, an additional plug connected to the buried plug may be further formed The gate lines 154 may be electrically insulated from the active region 104 by the gate insulating layer 152, and may be formed of a doped polysilicon, a metal (Al, W, Cu, Ti, Ir, Ru, Pt, etc.), a metallic silicide, or a metallic nitride or may have a stack structure thereof. In addition, a capping pattern 156 may be formed on the gate lines 154, and gate spacers 158 may be formed on opposite sides of the gate lines 154 and the capping pattern 156. The gate insulating layer 152 may be a silicon oxide layer or an insulating layer with a high dielectric constant. In addition, the capping pattern 156 and the gate spacers 158 may be formed using a silicon nitride layer.

The bit lines may be perpendicular to or parallel to the gate lines 154, and may be insulated from the gate lines 154 by using an insulating material. The bit lines may be formed of a doped polysilicon, a metal (Al, W, Cu, Ti, Ir, Ru, Pt, etc.), a metallic silicide, or a metallic nitride or may have a stack structure thereof. A bit line capping pattern (not shown) may be formed on the bit lines, and bit line spacers (not shown) may be formed on opposite sides of the bit lines and the bit line capping pattern.

In order to form a capacitor, a lower electrode layer 400, which is a conductor connected to the contact plug 300, may be formed. The lower electrode layer 400 may be formed of a material that does not induce oxidation in a subsequent process. The lower electrode layer 400 may be formed of, for example, at least one conductive material selected from the group consisting of a doped polysilicon, a metal such as Al, W, Cu, Ti, Ir, Ru, Pt, etc., a metallic nitride such as WN or TiN, and/or a metallic silicide.

Although the lower electrode layer 400 is illustrated as a flat panel in FIG. 1, the inventive concept is not limited thereto. That is, the lower electrode layer 400 may have any of various structures as long as the capacitor structure including two electrodes and a dielectric formed between the electrodes is formed. The lower electrode layer 400 may also be referred to as a first electrode layer 400.

The multi-layer of dielectric layers 500 may be formed on the lower electrode layer 400 as a capacitor dielectric layer. The multi-layer of dielectric layers 500 may be formed of a metal oxide layer or a crystalline multi-layer of metallic silicate layers, and will be described in detail later. An upper electrode layer 600 (hereinafter, also referred to as an electrode layer) may be formed on the multi-layer of dielectric layers 500. The upper electrode layer 600 may be formed of, for example, at least one conductive material selected from the group consisting of a doped polysilicon, a metal (Al, W, Cu, Ti, Ir, Ru, Pt, etc.), a metallic silicide, metallic nitride, and/or a conductive metallic oxide ($RuO_2$, $IRO_2$, $SrRuO_3$, etc.). The upper electrode layer 600 may also be referred to as a second electrode layer 600.

Figure 2:
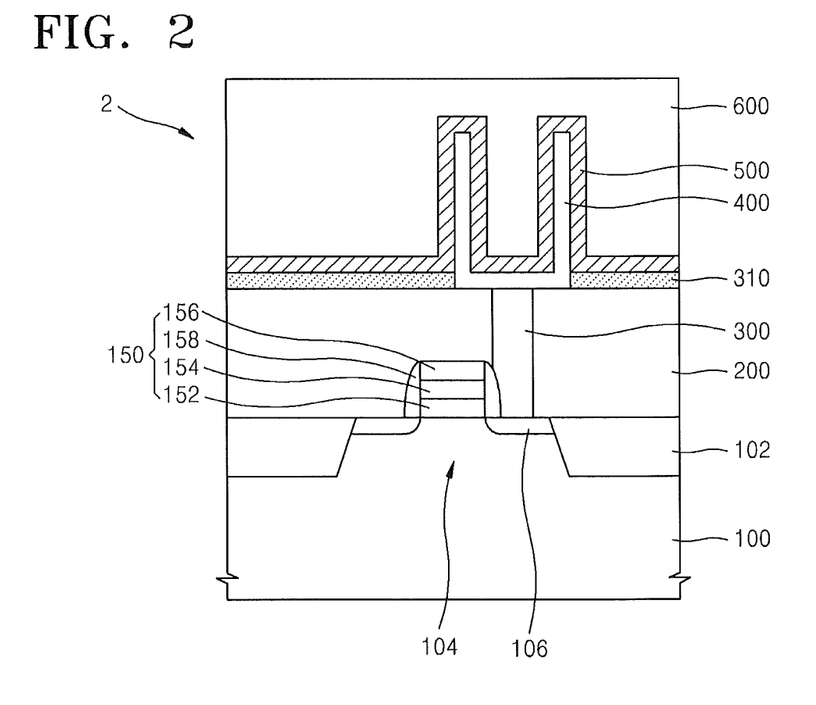

FIG. 2 is a cross-sectional view of another aspect of a semiconductor device 2 including a multi-layer of dielectric layers manufactured according to some embodiments of the inventive concept.

Referring to FIG. 2, a lower electrode layer 400 may have a cylindrical shape. In order to form the cylindrically shaped lower electrode layer 400, for example, a mold layer (not shown) may be formed on an interlayer insulating layer 200 having a contact plug 300. Then, an opening (not shown) exposing the contact plug 300 is formed in the mold layer, and a lower electrode material layer (not shown) may be formed on the mold layer in such a way that the opening is not completely filled and a surface of the mold layer exposed by the opening is completely covered. Then, the lower electrode material layer formed on the surface of the mold layer is removed while a portion of the lower electrode material layer in the opening remains, and the mold layer is removed.

In this regard, to prevent the interlayer insulating layer 200 from being removed when the mold layer is removed, an etch stopping pattern 310 exposing the contact plug 300 may be formed on the interlayer insulating layer 200.

The multi-layer of dielectric layers 500 and an upper electrode layer 600 may be sequentially formed on the cylindrically shaped lower electrode layer 400. Thus, the semiconductor device 2 including a capacitor is formed.

Figure 3:
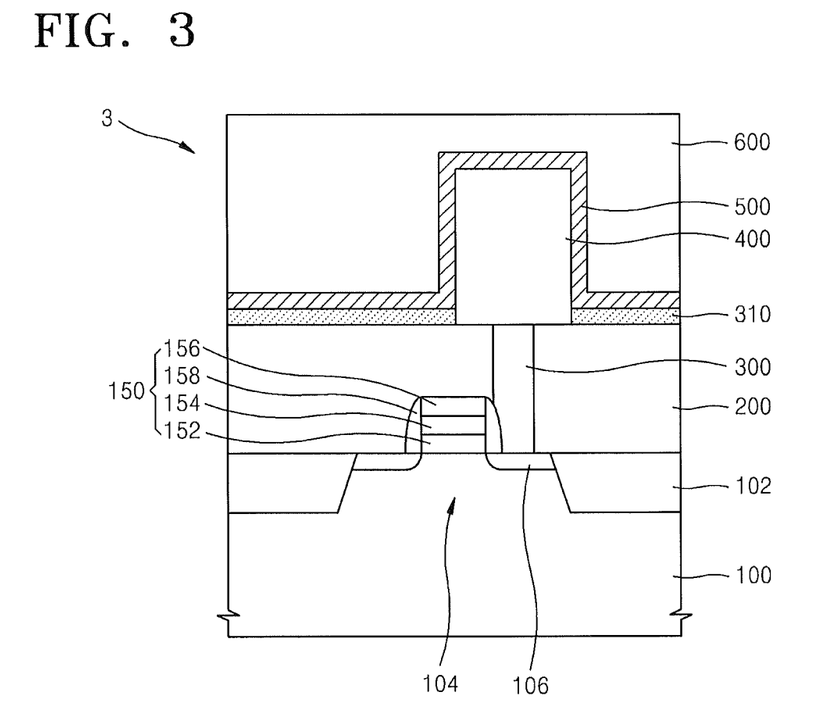

FIG. 3 is a cross-sectional view of another aspect of a semiconductor device 3 including a multi-layer of dielectric layers manufactured according to some embodiments of the inventive concept.

Referring to FIG. 3, a lower electrode layer 400 may have a pillar-shape. In order to form the pillar-shaped lower electrode layer 400, for example, a mold layer (not shown) may be formed on an interlayer insulating layer 200 having a contact plug 300. Then, an opening (not shown) exposing the contact plug 300 is formed in the mold layer, and a lower electrode material layer (not shown) may be formed on the mold layer in such a way that the opening is completely filled. Then, the lower electrode material layer formed on a surface of the mold layer is removed while a portion of the lower electrode material layer in the opening remains, and the mold layer is removed.

In this regard, to prevent the interlayer insulating layer 200 from being removed when the mold layer is removed, an etch stopping pattern 310 exposing the contact plug 300 may be formed on the interlayer insulating layer 200.

The multi-layer of dielectric layers 500 and an upper electrode layer 600 may be sequentially formed on the pillar-shaped lower electrode layer 400. Thus, the semiconductor device 3 including a capacitor is formed.

Figure 4:
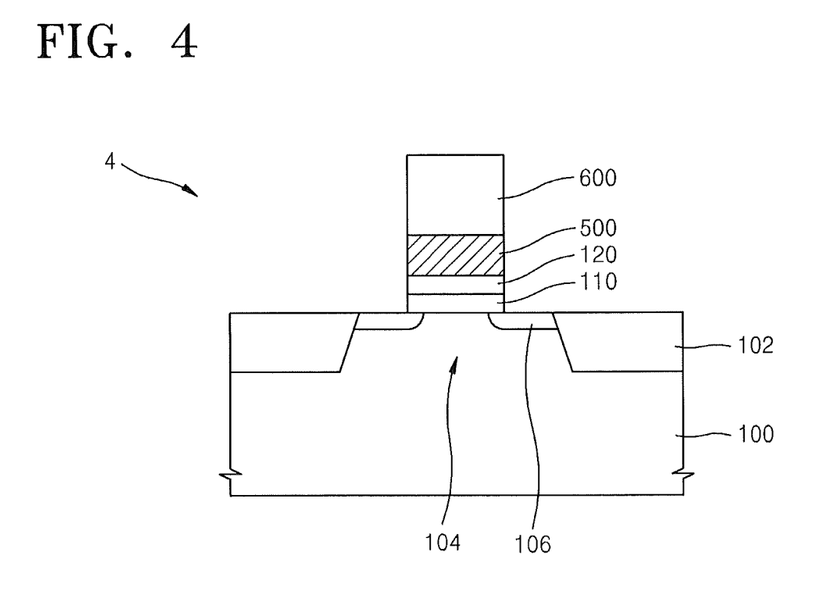

FIG. 4 is a cross-sectional view of another aspect of a semiconductor device 4 including a multi-layer of dielectric layers manufactured according to some embodiments of the inventive concept.

Referring to FIG. 4, the semiconductor device 4 may include a multi-layer of dielectric layers 500 as a blocking insulating layer. A tunneling oxide layer 110 may be formed on a semiconductor substrate 100. The semiconductor substrate 100 may be formed of, for example, a conventional semiconductor material, such as silicon. For example, an impurity implantation region (not shown) such as a well that is used to fabricate a semiconductor device such as a transistor, a device isolation layer 102 for separating individual semiconductor devices from each other, and source and drain regions 106 may be formed in the semiconductor substrate 100.

The tunneling insulation layer 110 may be formed such that the tunneling insulation layer 110 causes a tunneling operation, and may have a thickness of about 30 to about 800 Å. The tunneling insulation layer 110 may include a silicon oxide layer ($SiO_2$) or may include an insulating layer with a high dielectric constant, such as an oxide layer of hafnium or zirconium. However, the tunneling insulation layer 110 is not limited thereto.

A charge storage layer 120 may be formed on the tunneling insulation layer 110. The charge storage layer 120 may have a thickness of about 20 to about 200 Å, and may be formed of a conductive material or an insulating material. When the charge storage layer 120 is formed of a conductive material, the charge storage layer 120 may function as a floating gate. In this case, the charge storage layer 120 may be a conductive material including un-doped polysilicon, n-type or p-type impurity-doped polysilicon, or metal.

When the charge storage layer 120 is formed of an insulating material, the charge storage layer 120 may function as a trap layer. The charge storage layer 120 functioning as a trap layer may be formed of a material with a dielectric constant that is higher than that of a silicon oxide layer and lower than that of a blocking insulating layer, which will be described later. For example, if the dielectric constant of the silicon oxide layer is 3.9, the charge storage layer 120 may include a silicon nitride layer that has a dielectric constant of about 6, which is higher than 3.9. Accordingly, the blocking insulating layer may be formed such that the dielectric constant thereof is higher than 6. In this case, the charge storage layer 120 may include a nitride layer such as a silicon nitride layer, an aluminum nitride layer, or a silicon oxynitride layer.

The multi-layer of dielectric layers 500 may be formed as the blocking insulating layer on the charge storage layer 120, and an electrode layer 600 may be formed on the multi-layer of dielectric layers 500. The multi-layer of dielectric layers 500 may be formed of a metal oxide layer and a multi-layer of crystalline metallic silicate layers and will be described in detail later. The electrode layer 600 may include at least one conductive material selected from, for example, a doped polysilicon, a metal (Al, W, Cu, Ti, Ir, Ru, Pt, etc.), a metallic silicide, a metallic nitride, and/or a conductive metallic oxide ($RuO_2$, $IrO_2$, $SrRuO_3$, etc.). The electrode layer 600 may also be referred to as a second electrode layer 600.

As described above, when the charge storage layer 120 is formed of a conductive material, a flash memory (e.g., a floating gate-type non-volatile memory) device may be formed. On the other hand, when the charge storage layer 120 is formed of an insulating material, a charge trap-type flash memory (e.g., a floating trap-type non-volatile memory) device may be formed.

FIGS. 5 through 10 are cross-sectional views of aspects of a multi-layer of dielectric layers manufactured according to some embodiments of the inventive concept. The aspects of the multi-layer of dielectric layers described with reference to FIGS. 5 through 10 may be selectively applied to the manufacture of the semiconductor device including a multi-layer of dielectric layers manufactured according to some embodiments of the inventive concept described with reference to FIGS. 1 through 4.

Figure 5:
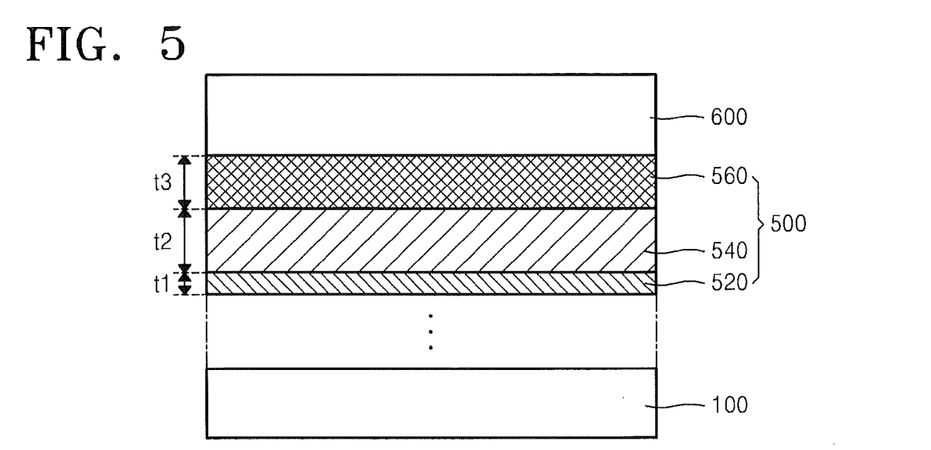
FIGS. 5 through 10 are cross-sectional views of aspects of a multi-layer of dielectric layers according to some embodiments of the inventive concept.

FIG. 5 is a cross-sectional view illustrating an aspect of a multi-layer of dielectric layers 500 manufactured according to some embodiments of the inventive concept.

Referring to FIG. 5, a multi-layer of dielectric layers 500 is formed on a semiconductor substrate 100. The multi-layer of dielectric layers 500 may include a metal oxide layer 520, a first metallic silicate layer 540, and a second metallic silicate layer 560. The metal oxide layer 520, the first metallic silicate layer 540, and/or the second metallic silicate layer 560 may be formed using, for example, an atomic layer deposition (ALD) method.

An electrode layer 600 may be formed on the multi-layer of dielectric layers 500. The electrode layer 600 may correspond to the upper electrode layer 600 illustrated in FIGS. 1 through 3 or the electrode layer 600 illustrated in FIG. 4. The electrode layer 600 may be formed at a process temperature of about 400° C. or higher. For example, the electrode layer 600 may be formed at a process temperature of about 400° C. to about 750° C. A process temperature refers to a temperature of heat applied to the semiconductor substrate 100 while the electrode layer 600 is being formed. The electrode layer 600 may be formed using a sputtering method, a chemical vapor deposition (CVD) method, an ALD method, or the like.

The metal oxide layer 520 may be formed of a zirconium oxide, a hafnium oxide, and/or a hafnium-zirconium oxide. The metal oxide layer 520 may be a crystalline material having a cubic system, a tetragonal system or an orthorhombic system crystalline structure. If the metal oxide layer 520 is formed of a crystalline material, it may also be referred to as a crystalline metal oxide layer 520.

The first metallic silicate layer 540 may be formed of a hafnium silicate, a zirconium silicate, and/or a hafnium-zirconium silicate. The second metallic silicate layer 560 may be formed of a hafnium silicate, a zirconium silicate, and/or a hafnium-zirconium silicate. The first metallic silicate layer 540 or the second metallic silicate layer 560 may be formed of a crystalline material having a cubic system, a tetragonal system or an orthorhombic system crystalline structure. If the first metallic silicate layer 540 or the second metallic silicate layer 560 is formed of a crystalline material, they may also be referred to as a first crystalline metallic silicate layer 540 or a second crystalline metallic silicate layer 560.

The first metallic silicate layer 540 and the second metallic silicate layer 560 may be formed of a metallic silicate including the same type of metal atom. For example, both the first metallic silicate layer 540 and the second metallic silicate layer 560 may be formed of a hafnium-zirconium silicate, a hafnium silicate, and/or a zirconium silicate.

The metal oxide layer 520, the first metallic silicate layer 540, and the second metallic silicate layer 560 may be formed of a metallic silicate including only the same type of metal atom. For example, the metal oxide layer 520 may be a hafnium-zirconium oxide, and the first metallic silicate layer 540 and the second metallic silicate layer 560 may be formed of a hafnium-zirconium silicate. In some embodiments, for example, the metal oxide layer 520 may be a zirconium oxide, and the first metallic silicate layer 540 and the second metallic silicate layer 560 may be a zirconium silicate. Some embodiments provide that, for example, the metal oxide layer 520 may be a hafnium oxide, and the first metallic silicate layer 540 and the second metallic silicate layer 560 may be a hafnium silicate.

In some embodiments, the metal oxide layer 520, the first metallic silicate layer 540, and the second metallic silicate layer 560 may be formed of a metallic silicate including at least one identical metal atom. For example, the metal oxide layer 520 may be a zirconium oxide or a hafnium oxide, and the first metallic silicate layer 540 and the second metallic silicate layer 560 may be a hafnium zirconium silicate. Some embodiments provide that, for example, the metal oxide layer 520 may be a hafnium-zirconium oxide, and both the first metallic silicate layer 540 and the second metallic silicate layer 560 may be a hafnium silicate or a zirconium silicate.

A hafnium oxide or a hafnium silicate may be an insulating material having a relatively large band gap. A zirconium oxide or a zirconium silicate may be an insulating material having a relatively high degree of crystallinity. Also, a hafnium-zirconium oxide or a hafnium-zirconium silicate may be an insulating material having an appropriate band gap and degree of crystallinity according to the ratio of hafnium and zirconium. Thus, the material of each dielectric layer of the multi-layer of dielectric layers 500 may be selected in consideration of insulating characteristics required of a semiconductor device to be manufactured.

If the metal oxide layer 520, the first metallic silicate layer 540, and the second metallic silicate layer 560 are all formed of a crystalline material, the multi-layer of dielectric layers 500 may have one of cubic system, tetragonal system, and orthorhombic system crystalline structures overall. The metal oxide layer 520, the first metallic silicate layer 540, and the second metallic silicate layer 560 may be all formed of equivalent crystalline system.

In the cubic system, tetragonal system, and orthorhombic system, there are three crystal axes perpendicular one another) ($\theta_1=\theta_2=\theta_3=90°$). All of three lattice constants are identical ($a_1=a_2=a_3$) in the cubic system. The cubic system may also be referred to as an isometric system. Two of three lattice constants are identical to each other and one of the lattice constants is different from the other two ($a_4=a_5\neq a_6$) in the tetragonal system. All of lattice constants are different from one another ($a_7\neq a_8$, $a_8\neq a_9$, $a_7\neq a_9$) in the orthorhombic system. If a crystalline metal oxide layer 520, a first crystalline metallic silicate layer 540, and a second crystalline metallic silicate layer 560 are formed to have a small thickness so they may be used in a highly integrated semiconductor devices, it may be difficult to distinguish the values of lattice constants. Accordingly, in this case, the crystal system will be described as "a cubic system, tetragonal system, or orthorhombic system." Hereinafter, a ratio of silicon atoms among all metal atoms and silicon atoms included in one layer or a plurality of layers may be referred to as a silicon concentration. A silicon concentration of the multi-layer of dielectric layers 500 refers to a ratio of silicon atoms among all metal atoms and silicon atoms included in a plurality of layers included in the multi-layer of dielectric layers 500. If a metal oxide layer 520 not including silicon atoms is included in the multi-layer of dielectric layers 500, a silicon concentration of the multi-layer of dielectric layers 500 may be referred to as an average silicon concentration of the multi-layer of dielectric layers 500.

Likewise, a silicon concentration of the first metallic silicate layer 540 and the second metallic silicate layer 560 refers to a ratio of silicon atoms among all metal atoms and silicon atoms included in the first metallic silicate layer 540 and the second metallic silicate layer 560.

Some embodiments provide that a silicon concentration of the first metallic silicate layer 540 or a silicon concentration of the second metallic silicate layer 560 refers to a ratio of silicon atoms among all metal atoms and silicon atoms included in the first metallic silicate layer 540 or the second metallic silicate layer 560, respectively. The silicon concentration of the first metallic silicate layer 540 and the silicon concentration of the second metallic silicate layer 560 may be different from each other.

For example, a second silicon concentration which is the silicon concentration of the second metallic silicate layer 560 may be higher than a first silicon concentration which is the silicon concentration of the first metallic silicate layer 540.

The higher the silicon concentration of a metallic silicate layer, the higher the density of a thin dielectric layer with the metallic silicate layer due to compression stress caused by silicon atoms, thereby improving reliability of the thin dielectric layer whit the metallic silicate layer. However, the higher the silicon concentration, the more the dielectric constant of the metallic silicate layer may be reduced.

If the average silicon concentration is less than about 3%, the density of a thin dielectric layer with the metallic silicate layer is decreased, which may reduce reliability of the thin dielectric layer with the metallic silicate layer. Also, if the average silicon concentration is over about 8%, a dielectric constant of the thin dielectric layer with the metallic silicate layer may decrease. Accordingly, the average silicon concentration of the multi-layer of dielectric layers 500 formed of the metal oxide layer 520, the first metallic silicate layer 540, and the second metallic silicate layer 560 may be set in a range from about 3% to about 8% for stable reliability and a high dielectric constant. The second silicon concentration of the second metallic silicate layer 560 may be set in a range from about 10% to about 25%. Considering the above, thicknesses of the metal oxide layer 520, the first metallic silicate layer 540, and the second metallic silicate layer 560, the first silicon concentration of the first silicon metallic silicate layer 540, and the second silicon concentration of the second metallic silicate layer 560 may be determined. For example, when the first silicon concentration and the second silicon concentration are each in a range from about 6% to about 16%, respectively, and the thicknesses of the metal oxide layer 520, the first metallic silicate layer 540, and the second metallic silicate layer 560 are set to be in a ratio of 1:4:2, the average silicon concentration of the multi-layer of dielectric layers 500 may be about 8%.

As described above, the thicknesses of the metal oxide layer 520, the first metallic silicate layer 540, and the second metallic silicate layer 560, the first silicon concentration of the first silicon metallic silicate layer 540, and the second silicon concentration of the second metallic silicate layer 560 may be determined in consideration of the thickness and the average silicon concentration of the multi-layer of dielectric layers 500.

In order to increase the total density of the multi-layer of dielectric layers 500, a first thickness t1, which is the thickness of the metal oxide layer 520, may be set to be relatively thin. Also, in order to obtain the average silicon concentration of the multi-layer of dielectric layers 500 of about 3% to about 8%, a third thickness t3, which is the thickness of the second metallic silicate layer 560 having a relatively high silicon concentration, may be set to be thinner than a second thickness t2, which is the thickness of the first metallic silicate layer 540 having a relatively low silicon concentration. Consequently, the second thickness t2 may be the greatest, and the first thickness t1 may be the smallest. That is, the third thickness t3 may be smaller than the second thickness t2 and greater than the first thickness t1.

For example, if the total thickness of the multi-layer of dielectric layers 500 is 70 Å, the first thickness t1 may be in a range from about 10 to about 15 Å, and the second thickness t2 may be in a range from about 35 to about 40 Å, and the third thickness t3 may be about 20 Å, but these thicknesses are not limited thereto.

The metal oxide layer 520, the first metallic silicate layer 540, and the second metallic silicate layer 560 may be formed first in an amorphous state, and then may be crystallized during a process for forming the electrode layer 600. That is, the metal oxide layer 520, the first metallic silicate layer 540, and the second metallic silicate layer 560 may be crystallized at a process temperature for forming the electrode layer 600, for example, at 400° C. to 750° C. In this case, a thermal treatment may not be necessary to crystallize the metal oxide layer 520, the first metallic silicate layer 540, and the second metallic silicate layer 560, and thus a thermal budget may be reduced or minimized for the manufacture of a semiconductor device.

A temperature needed to crystallize a metal oxide layer or a metallic silicate layer as separate homogeneous layers (i.e., a process temperature or a thermal treatment temperature) may be different from a temperature (i.e., a process temperature or a thermal treatment temperature) needed to crystallize a metal oxide layer or a metallic silicate layer included in the multi-layer of dielectric layers 500. A temperature needed to crystallize a metallic silicate layer formed as a separate homogeneous layer (i.e., a process temperature or a thermal treatment temperature) may be higher than a temperature needed to crystallize a metal oxide layer formed as a separate homogeneous layer.

In addition, a temperature needed to crystallize a metallic silicate layer formed as a separate homogeneous layer (i.e., a process temperature or a thermal treatment temperature) may be a higher if a silicon concentration is relatively high.

Here, forming a metal oxide layer or a metallic silicate layer formed as a separate homogeneous layer does not mean that only either a metal oxide layer or a metallic silicate layer is formed but means that a metal oxide layer or a metallic silicate layer is formed in such a way that they do not form a multi-layer with other layers formed of a similar material or having a similar crystallinity. Accordingly, a layer formed of other material or a layer having a different crystallinity may be adjacent to the metal oxide layer or the metallic silicate layer formed as a separate homogeneous layer. This is for the purpose of explaining by comparing with the multi-layer of dielectric layers 500 according to some embodiments of the inventive concept which include a plurality of insulating layers having a similar material or a similar crystallinity. The temperature needed to crystallize a metal oxide layer or a metallic silicate layer that is formed as a separate homogeneous layer may be referred to as a homogeneous crystallization temperature.

Among the metal oxide layer 520, the first metallic silicate layer 540, or the second metallic silicate layer 560 included in the multi-layer of dielectric layers 500, if a layer having a relatively high homogeneous crystallization temperature is in contact with a layer having a relatively low homogeneous crystallization temperature, the layer with the relatively high homogeneous crystallization temperature may be crystallized at a temperature (i.e., a process temperature or a thermal treatment temperature) that is lower than its original, relatively high homogeneous crystallization temperature.

The layer having a relatively low homogeneous crystallization temperature may be first crystallized before a layer having a relatively high homogeneous crystallization temperature is crystallized. The layer having a relatively low crystallization temperature that is first crystallized may function as a seed layer for crystallizing a layer having a relatively high homogeneous crystallization temperature. Consequently, if there is a seed layer, the layer may be crystallized at a temperature lower than the homogeneous crystallization temperature.

A metallic silicate may have a higher homogeneous crystallization temperature than a metal oxide not including a silicon. Also, a metallic silicate with a relatively high silicon concentration may have a higher homogeneous crystallization temperature than a metallic silicate with a relatively low silicon concentration. That is, among the metal oxide layer 520, the first metallic silicate layer 540, and/or the second metallic silicate layer 560 included in the multi-layer of dielectric layers 500, the metal oxide layer 520 may have the lowest homogeneous crystallization temperature, and the second metallic silicate layer 560 may have the highest homogeneous crystallization temperature.

Accordingly, if in contact with the metal oxide layer 520, the first metallic silicate layer 540 may be crystallized at a temperature lower than its original homogeneous crystallization temperature. Also, if in contact with the metal oxide layer 520 or the first metallic silicate layer 540, the second metallic silicate layer 560 may be crystallized at a temperature lower than its original homogeneous crystallization temperature. Thus, the multi-layer of dielectric layers 500 may be crystallized at a temperature lower than the highest homogeneous crystallization temperature among those of the layers forming the multi-layer of dielectric layers 500.

Also, the metal oxide layer 520, the first metallic silicate layer 540, or the second metallic silicate layer 560 may be crystallized in-situ. For example, a crystalline metal oxide layer 520 may be crystallized in-situ, and then a first crystalline metallic silicate layer 540 may be crystallized in-situ on the crystalline metal oxide layer 520 by using the crystalline metal oxide layer 520 as a seed layer. Likewise, a second crystalline metallic silicate layer 560 may be crystallized in-situ on the first crystalline metallic silicate layer 540 by using the first crystalline metallic silicate layer 540 as a seed layer.

Figure 6:
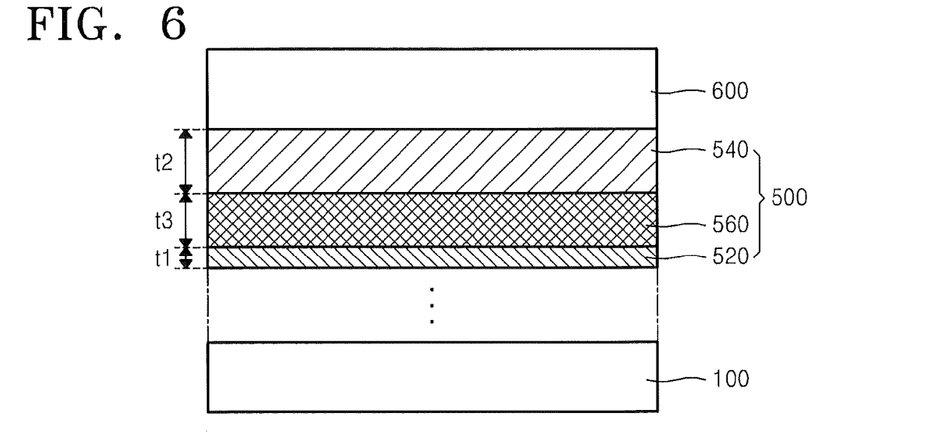

FIG. 6 is a cross-sectional view of another aspect of a multi-layer of dielectric layers 500 according to some embodiments of the inventive concept.

Referring to FIG. 6, the multi-layer of dielectric layers 500 is formed on the semiconductor substrate 100. The multi-layer of dielectric layers 500 may be formed of a metal oxide layer 520, a first metallic silicate layer 540, and a second metallic silicate layer 560 that are sequentially disposed on one another. The metal oxide layer 520, the first metallic silicate layer 540, and/or the second metallic silicate layer 560 may be formed using, for example, an ALD method.

The multi-layer of dielectric layers 500 formed of a crystalline metal oxide layer 520, a first crystalline metallic silicate layer 540, and/or a second crystalline metallic silicate layer 560 may have a cubic system, tetragonal system, or orthorhombic system crystalline structure.

A second silicon concentration, which is a silicon concentration of the second metallic silicate layer 560, may be higher than a first silicon concentration, which is a silicon concentration of the first metallic silicate layer 540. An average silicon concentration which is a ratio of silicon atoms among all metal atoms and silicon atoms included in the multi-layer of dielectric layers 500 may be set in a range from about 3% to about 8%. To this end, the second silicon concentration of the second metallic silicate layer 560 may be set to be in a range from about 10% to about 25%.

In order to increase the total density of the multi-layer of dielectric layers 500, a first thickness t1, which is the thickness of the metal oxide layer 520, may be set to be relatively thin. Also, in order to obtain the average silicon concentration of the multi-layer of dielectric layers 500 of about 3% to about 8%, a third thickness t3, which is the thickness of the second metallic silicate layer 560 having a relatively high silicon concentration, may be set to be thinner than a second thickness t2, which is the thickness of the first metallic silicate layer 540 having a relatively low silicon concentration. Consequently, the second thickness t2 may be the greatest, and the first thickness t1 may be the smallest. That is, the third thickness t3 may be smaller than the second thickness t2 and greater than the first thickness t1.

The metal oxide layer 520, the first metallic silicate layer 540, and the second metallic silicate layer 560 may be formed first in an amorphous state, and then may be crystallized during a process for forming the electrode layer 600.

Figure 7:
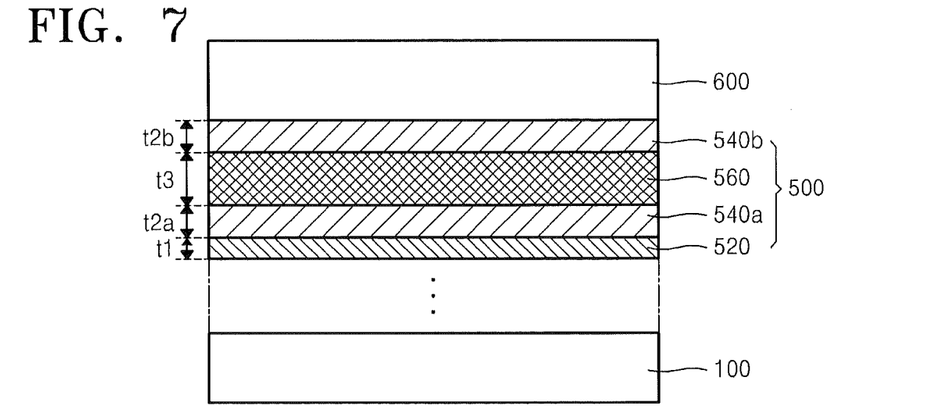

FIG. 7 is a cross-sectional view of another aspect of a multi-layer of dielectric layers 500 according to some embodiments of the inventive concept.

Referring to FIG. 7, the multi-layer of dielectric layers 500 is formed on the semiconductor substrate 100. The multi-layer of dielectric layers 500 may be formed of a metal oxide layer 520, and two first metallic silicate layers 540a and 540b, and a second metallic silicate layer 560 that are disposed on the metal oxide layer 520. The metal oxide layer 520 may be interposed between the two first metallic silicate layers 540a and 540b. The metal oxide layer 520, the first metallic silicate layers 540a and 540b, or the second metallic silicate layer 560 may be formed using, for example, an ALD method.

The multi-layer of dielectric layers 500 formed of a crystalline metal oxide layer 520, first crystalline metallic silicate layers 540a and 540b, and a second crystalline metallic silicate layer 560 may have a cubic system, tetragonal system, or orthorhombic system crystalline structure.

A second silicon concentration, which is a silicon concentration of the second metallic silicate layer 560, may be higher than a first silicon concentration, which is an average silicon concentration of the first metallic silicate layers 540a and 540b. An average silicon concentration, which is a ratio of silicon atoms among all metal atoms and silicon atoms included in the multi-layer of dielectric layers 500, may be set in a range from about 3% to about 8%. To this end, the second silicon concentration of the second metallic silicate layer 560 may be set to be in a range from about 10% to about 25%.

Considering the above, thicknesses of the metal oxide layer 520, the two first metallic silicate layers 540a and 540b, and the second metallic silicate layer 560, the first silicon concentration of the first silicon metallic silicate layers 540a and 540b, and the second silicon concentration of the second metallic silicate layer 560 may be determined.

In order to increase the total density of the multi-layer of dielectric layers 500, a first thickness t1, which is the thickness of the metal oxide layer 520, may be set to be relatively thin. Also, in order to obtain the average silicon concentration of the multi-layer of dielectric layers 500 of about 3% to about 8%, a third thickness t3, which is the thickness of the second metallic silicate layer 560 having a relatively high silicon concentration, may be set to be thinner than a second thickness t2a+t2b, which is a total of the thicknesses of the two first metallic silicate layers 540a and 540b having a relatively low silicon concentration. Consequently, the second thickness t2a+t2b may be the greatest, and the first thickness t1 may be the smallest. That is, the third thickness t3 may be smaller than the second thickness t2a+t2b and greater than the first thickness t1.

Some embodiments provide that silicon concentrations of the two first metallic silicate layers 540a and 540b may be different from each other. However, also in such cases, the silicon concentrations of the two first metallic silicate layers 540a and 540b may be formed to be lower than the second silicon concentration of the second metallic silicate layer 560.

Also, the first metallic silicate layer 540 may also include three or more layers instead of two layers. In such cases the second metallic silicate layer 560 may be disposed between two adjacent first metallic silicate layers 540a and 540b to form the multi-layer of dielectric layers 500. That is, the multi-layer of dielectric layers 500 may be formed such that m second metallic silicate layers 260 are formed between m+1 first metallic silicate layers 540 in addition to the metal oxide layer 520 (where m is a positive integer greater than 2).

The metal oxide layer 520, the two first metallic silicate layers 540a and 540b, and the second metallic silicate layer 560 may be formed first in an amorphous state, and then may be crystallized during a process for forming the electrode layer 600.

Figure 8:
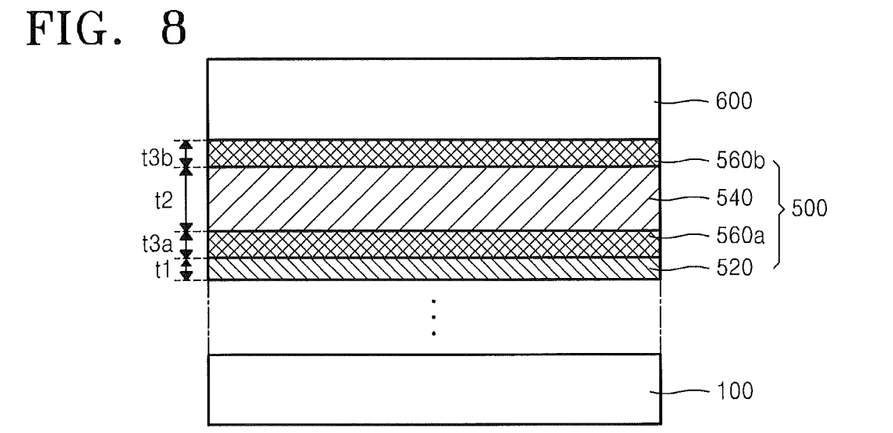

FIG. 8 is a cross-sectional view of another aspect of a multi-layer of dielectric layers 500 according to an embodiment of the inventive concept.

Referring to FIG. 8, the multi-layer of dielectric layers 500 is formed on the semiconductor substrate 100. The multi-layer of dielectric layers 500 may be formed of a metal oxide layer 520, and a first metallic silicate layer 540 and two second metallic silicate layers 560a and 560b that are disposed on the metal oxide layer 520. The first metallic silicate layer 540 may be interposed between the two second metallic silicate layers 560a and 560b. The metal oxide layer 520, the first metallic silicate layer 540, and/or the second metallic silicate layers 560a and 560b may be formed using, for example, an ALD method.

The multi-layer of dielectric layers 500 formed of a crystalline metal oxide layer 520, and a first crystalline metallic silicate layer 540, and second crystalline metallic silicate layers 560a and 560b, may have a cubic system, tetragonal system, and/or orthorhombic system crystalline structure.

A second silicon concentration, which is an average of silicon concentrations of the two second metallic silicate layers 560a and 560b, may be higher than a first silicon concentration, which is a silicon concentration of the first metallic silicate layer 540. An average silicon concentration, which is a ratio of silicon atoms among all metal atoms and silicon atoms included in the multi-layer of dielectric layers 500, may be set in a range from about 3% to about 8%. To this end, the second silicon concentration, which is the average of silicon concentrations of the two second metallic silicate layers 560a and 560b, may be set to be in a range from about 10% to about 25%.

Considering the above, thicknesses of the metal oxide layer 520, the first metallic silicate layer 540, and the two second metallic silicate layers 560a and 560b, the first silicon concentration of the first silicon metallic silicate layer 540, and the second silicon concentration of the two second metallic silicate layers 560a and 560b may be determined.

In order to increase the total density of the multi-layer of dielectric layers 500, a first thickness t1, which is the thickness of the metal oxide layer 520, may be set to be relatively thin. Also, in order to obtain the average silicon concentration of the multi-layer of dielectric layers 500 of about 3% to about 8%, a third thickness t3a+t3b, which is a total of the thicknesses of the second metallic silicate layers 560a and 560b having a relatively high silicon concentration, may be set to be thinner than a second thickness t2, which is the thickness of the first metallic silicate layer 540 having a relatively low silicon concentration. Consequently, the second thickness t2 may be the greatest, and the first thickness t1 may be the smallest. That is, the third thickness t3a+t3b may be smaller than the second thickness t2 and greater than the first thickness t1.

In some embodiments, silicon concentrations of the two second metallic silicate layers 560a and 560b may be different from each other. However, also in this case, silicon concentrations of the two second metallic silicate layers 560a and 560b may be set to be lower than the first silicon concentration of the first metallic silicate layer 540.

Also, the second metallic silicate layer 560 may also include three or more layers instead of two layers, and in this case, the first metallic silicate layer 540 may be disposed between two adjacent second metallic silicate layers 560a and 560b to form the multi-layer of dielectric layers 500. That is, the multi-layer of dielectric layers 500 may be formed such that n first metallic silicate layers 540 are formed between n+1 second metallic silicate layers 560 in addition to the metal oxide layer 520 (where n is a positive integer greater than 2).

The metal oxide layer 520, the first metallic silicate layer 540, and the two second metallic silicate layers 560a and 560b may be formed first in an amorphous state, and then may be crystallized during a process for forming the electrode layer 600.

Figure 9:
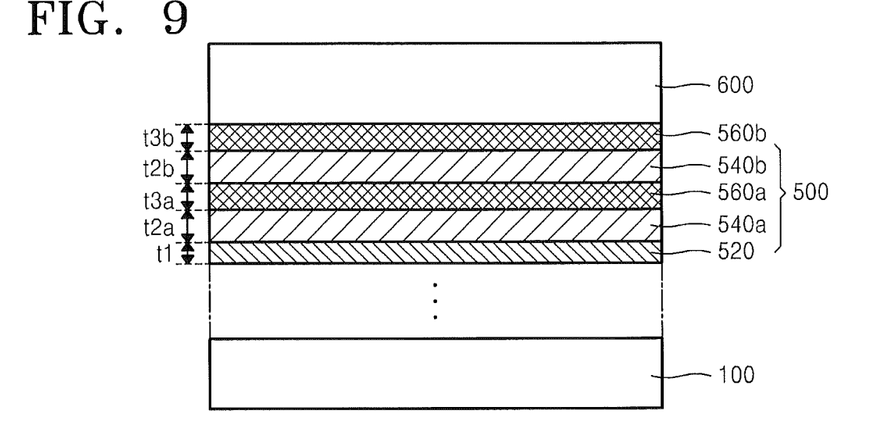

FIG. 9 is a cross-sectional view of another aspect of a multi-layer of dielectric layers 500 according to some embodiments of the inventive concept.

Referring to FIG. 9, the multi-layer of dielectric layers 500 is formed on the semiconductor substrate 100. The multi-layer of dielectric layers 500 may be formed of a metal oxide layer 520, and first metallic silicate layers 540a and 540b and second metallic silicate layers 560a and 560b that are sequentially and alternately disposed twice on the metal oxide layer 520. Also, the multi-layer of dielectric layers 500 may be formed such that first metallic silicate layers 540a and 540b and second metallic silicate layers 560a and 560b are sequentially and alternately disposed three or more times on the metal oxide layer 520.

The multi-layer of dielectric layers 500 formed of a crystalline metal oxide layer 520, and at least two first crystalline metallic silicate layers 540a and 540b, and at least two second crystalline metallic silicate layers 560a and 560b, may have a cubic system, tetragonal system, or orthorhombic system crystalline structure.

A second silicon concentration, which is an average of silicon concentrations of the two second metallic silicate layers 560a and 560b, may be higher than a first silicon concentration, which is an average of silicon concentrations of the two first metallic silicate layers 540a and 540b. An average silicon concentration, which is a ratio of silicon atoms among all metal atoms and silicon atoms included in the multi-layer of dielectric layers 500, may be set in a range from about 3% to about 8%. To this end, the second silicon concentration of the two second metallic silicate layers 560a and 560b may be set to be in a range from about 10% to about 25%.

In order to increase the total density of the multi-layer of dielectric layers 500, a first thickness t1 which is the thickness of the metal oxide layer 520 may be set to be relatively thin. Also, in order to obtain the average silicon concentration of the multi-layer of dielectric layers 500 of 3% to 8%, a third thickness t3a+t3b, which is a total of the thicknesses of the at least two second metallic silicate layers 560a and 560b having a relatively high silicon concentration, may be set to be thinner than a second thickness t2a+t2b, which is a total of the thicknesses of the at least two first metallic silicate layers 540a and 540b having a relatively low silicon concentration. Consequently, the second thickness t2a+t2b may be the greatest, and the first thickness t1 may be the smallest. That is, the third thickness t3a+t3b may be smaller than the second thickness t2a+t2b and greater than the first thickness t1.

The metal oxide layer 520, the two first metallic silicate layers 540a and 540b, and the second metallic silicate layers 560a and 560b may be formed first in an amorphous state, and then may be crystallized during a process for forming the electrode layer 600.

Figure 10:
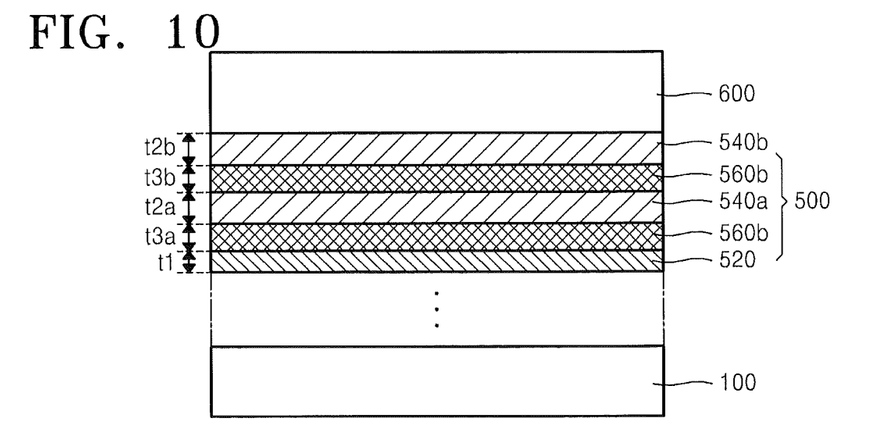

FIG. 10 is a cross-sectional view of another aspect of a multi-layer of dielectric layers 500 according to some embodiments of the inventive concept.

Referring to FIG. 10, the multi-layer of dielectric layers 500 is formed on the semiconductor substrate 100. The multi-layer of dielectric layers 500 may be formed of a metal oxide layer 520, and second metallic silicate layers 560a and 560b and first metallic silicate layers 540a and 540b that are sequentially and alternately disposed twice on the metal oxide layer 520. Also, the multi-layer of dielectric layers 500 may be formed such that second metallic silicate layers 560a and 560b and first metallic silicate layers 540a and 540b are sequentially and alternately disposed three or more times on the metal oxide layer 520.

The metal oxide layer 520, the two first metallic silicate layers 540a and 540b, and the second metallic silicate layers 560a and 560b may be formed first in an amorphous state, and then may be crystallized during a process for forming the electrode layer 600.

Various aspects of the multi-layer of dielectric layers 500 are described with reference to FIGS. 5 through 10 as above. In addition, in order to set an average silicon concentration, which is a ratio of silicon atoms among all metal atoms and silicon atoms included in the multi-layer of dielectric layers 500, to be in a desired range, for example, from about 3% to about 8%, three or more metallic silicate layers having different silicon concentrations may be disposed to form the multi-layer of dielectric layers 500.

Figure 11:
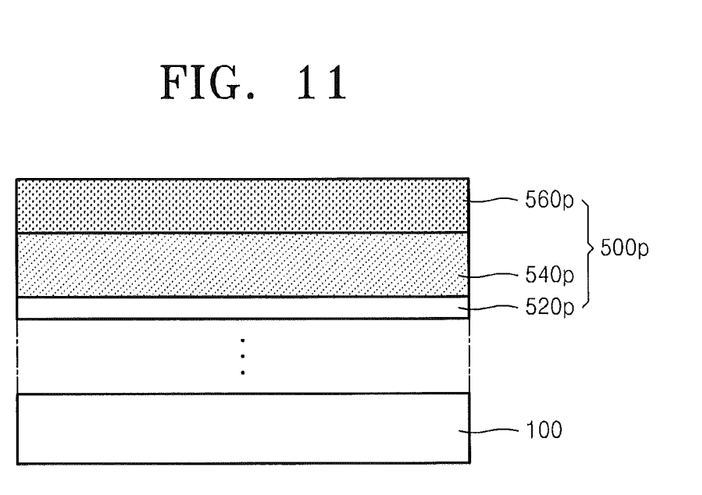
FIGS. 11 and 12 are cross-sectional views illustrating methods of manufacturing a multi-layer of dielectric layers according to some embodiments of the inventive concept.
Figure 12:
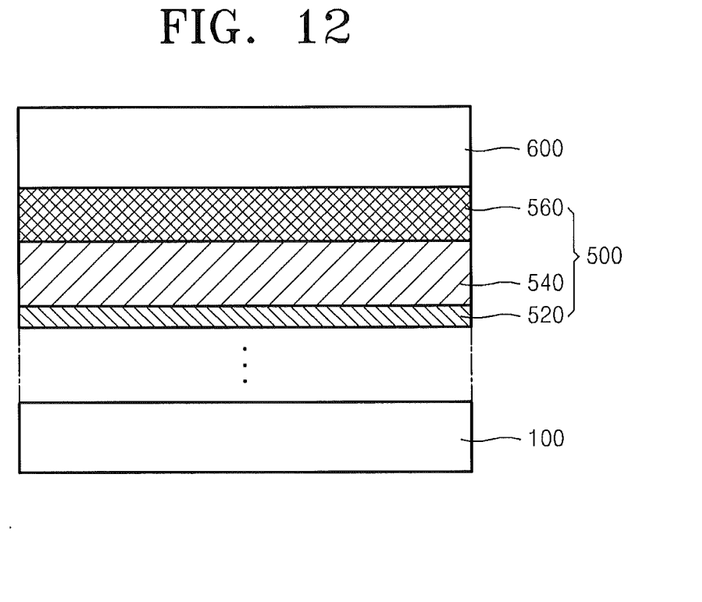

FIGS. 11 and 12 are cross-sectional views illustrating methods of manufacturing a multi-layer of dielectric layers 500 according to some embodiments of the inventive concept. In detail, FIGS. 11 and 12 are cross-sectional views illustrating a method of manufacturing the multi-layer of dielectric layers 500 illustrated in FIG. 5 according to manufacturing steps.

Referring to FIG, 11, an amorphous metal oxide layer 520p, a first amorphous metallic silicate layer 540p, and a second amorphous metallic silicate layer 560p are sequentially formed on a semiconductor substrate 100 to form a first preliminary multi-layer of dielectric layers 500p. Referring to FIGS. 11 and 12 together, an electrode layer 600 is formed on the first preliminary multi-layer of dielectric layers 500p. The electrode layer 600 may be formed of at least one conductive material selected from a doped polysilicon, a metal (e.g., Al, W, Cu, Ti, Ir, Ru, Pt, etc.), a metal silicide, a metal nitride, and/or a conductive metal oxide (e.g., $RuO_2$, $IrO_2$, $SrRuO_3$, etc.), or a combination including one or more of these. The electrode layer 600 may be formed at a process temperature of about 400° C. or higher. For example, the electrode layer 600 may be formed at a process temperature of about 400° C. to about 750° C. A process temperature refers to a temperature of heat applied to the semiconductor substrate 100 while the electrode layer 600 is being formed. The electrode layer 600 may be formed using a sputtering method, a CVD method, an ALD method, or the like.

The amorphous metal oxide layer 520p, the first amorphous metallic silicate layer 540p, and the second amorphous metallic silicate layer 560p which form the first preliminary multi-layer of dielectric layers 500p may be crystallized at a process temperature at which the electrode layer 600 is formed.

The multi-layer of dielectric layers 500 formed according to some embodiments of the inventive concept described with reference to FIGS. 11 and 12 shows the same aspect as the aspect of the multi-layer of dielectric layers 500 described with reference to FIG. 5. Also, the multi-layer of dielectric layers 500 according to the aspects described with reference to FIGS. 6 through 10 may be formed by modifying the methods of forming the multi-layer of dielectric layers 500 described with reference to FIGS. 11 and 12.

Figure 13:
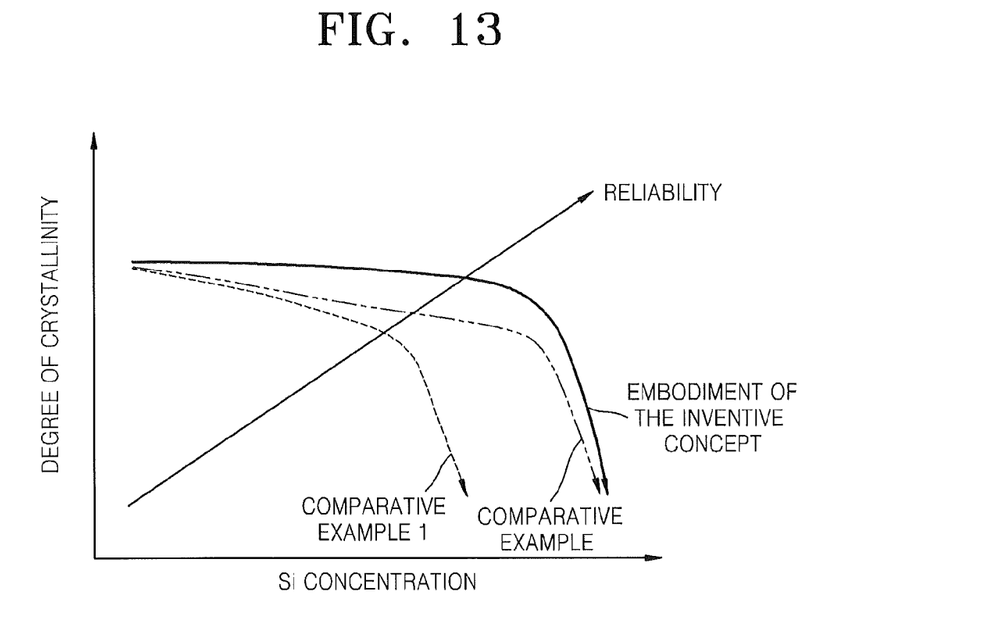
FIG. 13 is a graph comparing characteristics of a multi-layer of dielectric layers formed according to the embodiments of the inventive concept with those of a dielectric layer formed of a single crystalline metallic silicate layer or of two crystalline metallic silicate layers.

FIG. 13 is a graph comparing characteristics of a multi-layer of dielectric layers formed according to embodiments of the inventive concept with those of a dielectric layer formed of a single crystalline metallic silicate layer or of two crystalline metallic silicate layers.

Referring to FIG. 13, reliability of a dielectric layer is improved as silicon (Si) concentration increases; however, the degree of crystallinity of the dielectric layer abruptly decreases at a predetermined Si concentration or greater. However, the degree of crystallinity of a multi-layer of dielectric layers according to some embodiments of the inventive concept does not decrease until a Si concentration is reached that is higher than Si concentrations at which a degree of crystallinity of the dielectric layer according to Comparative example 1 or Comparative example 2 decreases.

The dielectric layer according to Comparative example 1 is formed of a single crystalline metallic silicate layer, and the dielectric layer according to Comparative example 2 is formed of two crystalline metallic silicate layers having different silicon concentrations.

Also, compared to the dielectric layer according to Comparative example 2, the degree of crystallinity of the multi-layer of dielectric layers according to the current embodiment of the inventive concept decreases less with the increase in the Si concentration. Accordingly, the multi-layer of dielectric layers according to the current embodiment of the inventive concept has a higher dielectric constant than a dielectric layer formed of two metallic silicate layers having different silicon concentrations and also improved reliability.

Figure 14:
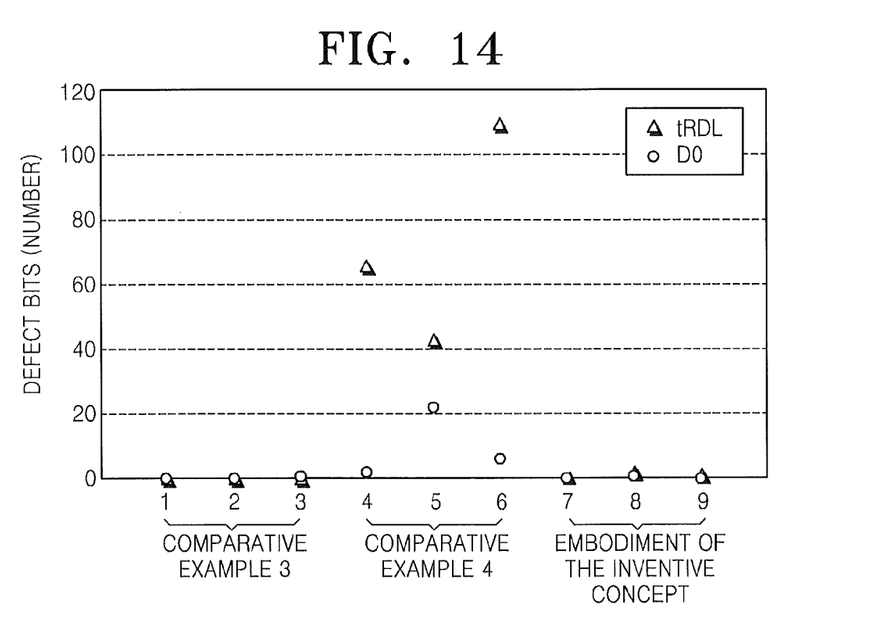
FIG. 14 is a graph comparing characteristics of a semiconductor device including a multi-layer of dielectric layers formed according to some embodiments of the inventive concept with those of a semiconductor device including a dielectric layer formed of a single crystalline metallic silicate layer or of two crystalline metallic silicate layers.

FIG. 14 is a graph comparing characteristics of a semiconductor device including a multi-layer of dielectric layers formed according to some embodiments of the inventive concept with those of a semiconductor device including a dielectric layer formed of a single crystalline metallic silicate layer or of two crystalline metallic silicate layers.

Referring to FIG. 14, test results regarding last data in to row precharge (tRDL) and data reading (D0) parameters of semiconductor devices according to embodiments of the inventive concept, Comparative example 3, and Comparative example 4 are compared. A data reading D0 parameter writes 0 to a semiconductor device, and measures errors occurring during a reading operation.

Comparative example 3 is a semiconductor memory device including a dielectric layer formed of a plurality of metal oxide layers as a capacitor dielectric layer, and Comparative example 4 is a semiconductor memory device including a dielectric layer formed of two different metallic silicate layers as a capacitor dielectric layer.

The dielectric layer of Comparative example 4 has the same or a similar dielectric constant as that of the multi-layer of dielectric layers according to some embodiments of the inventive concept, but the dielectric layer of Comparative example 3 has a lower dielectric constant than that of the multi-layer of dielectric layers according to some embodiments of the inventive concept.

Both the semiconductor device including the dielectric layer of Comparative example 3 and the semiconductor device including the multi-layer of dielectric layers according to embodiments of the inventive concept have almost no defect bits. However, since the multi-layer of dielectric layers according to embodiments of the inventive concept has a relatively high dielectric constant, it may be more advantageous in manufacturing a highly integrated semiconductor device.

Unlike the semiconductor device including the multi-layer of dielectric layers according to embodiments of the inventive concept, the semiconductor device including the dielectric layer of Comparative example 4 has a number of defect bits. In the semiconductor device including the dielectric layer of Comparative example 4, several to several tens of defect bits may be generated per 1 Gbit.

That is, although the dielectric layer of Comparative example 4 has a higher dielectric constant than that of the dielectric layer of Comparative example 3, a semiconductor device including the dielectric layer of Comparative example 4 may be more likely to have defect bits compared to a semiconductor device including the dielectric layer of Comparative example 3. Also, the semiconductor device including the dielectric layer of Comparative example 4 may be more likely to have defect bits compared to a semiconductor device including the multi-layer of dielectric layers according to some embodiments of the inventive concept.

This may be taken to be due to a difference in the degree of crystallinity of the dielectric layer of Comparative example 4 and the multi-layer of dielectric layers according to an embodiment of the inventive concept, which degrades a boundary characteristic between the dielectric layer of Comparative example 4 and a layer therebelow, that is, a lower electrode layer.

Figure 15:
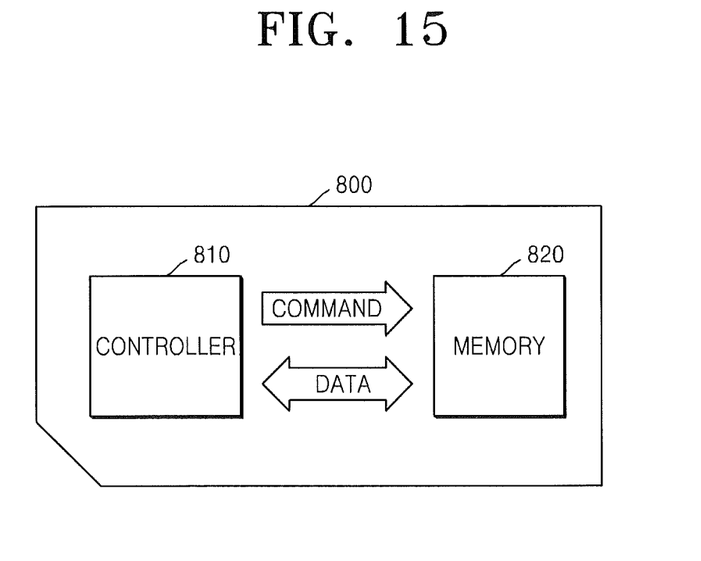
FIG. 15 is a schematic view illustrating a card according to some embodiments of the inventive concept.

In other words, the multi-layer of dielectric layers according to embodiments of the inventive concept may have a good degree of crystallinity, a high dielectric constant, and highly dense layers FIG. 15 is a schematic view illustrating a card 800 according to some embodiments of the inventive concept.

The card 800 may be disposed such that a controller 810 and a memory 820 exchange electrical signals with each other. For example, when the controller 810 gives a command, the memory 820 may transmit data. Accordingly, the card 800 may store data in the memory 820 or output the data from the memory 820.

The memory 820 may include a memory device such as the semiconductor devices according to some embodiments of the inventive concept. Examples of the memory devices used here may include, but are not limited to, a dynamic random access memory (DRAM), a static RAM (SRAM), a flash memory, and/or a phase change RAM (PRAM).

The card 800 may be used in various portable electronic devices, such as a secure digital card (SD) or a multimedia card (MMC).

Figure 16:
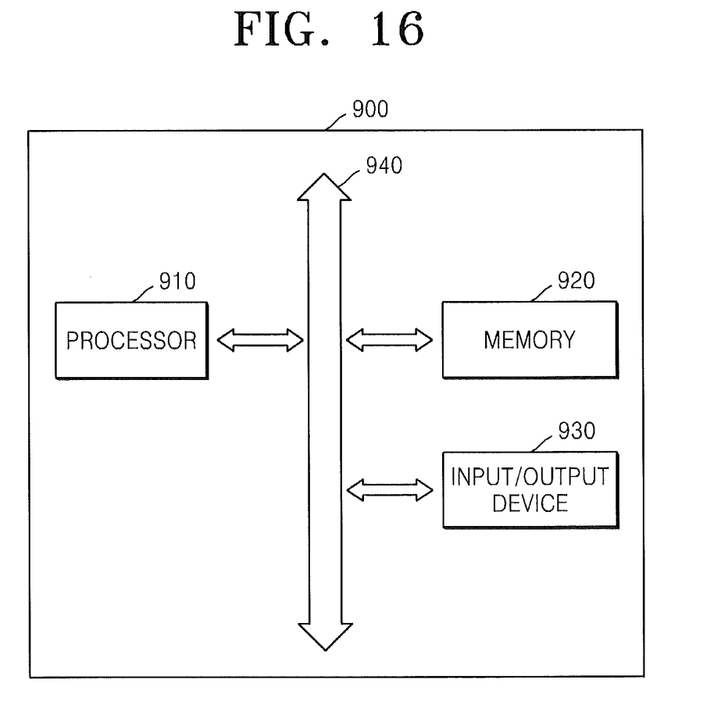
FIG. 16 is a block diagram illustrating a system according to some embodiments of the inventive concept.

FIG. 16 is a schematic view illustrating a system 900 including a semiconductor device according to some embodiments of the inventive concept.

Referring to FIG. 16, the system 900 may include a processor 910, an input/output device 930, and a memory 920 which may perform data communications with one another via a bus 940. The processor 910 may execute programs and control the system 900. The input/output device 930 may be used to input or output data of the system 900. The system 900 may be connected to an external device such as a personal computer (PC) or a network, by using the input/output device 930 to exchange data with the external device.

The memory 920 may store codes and data for operating the processor 910. For example, the memory 920 may include the semiconductor devices described with reference to FIGS. 1 through 4. Examples of the memory devices used here may include, but are not limited to, a dynamic random access memory (DRAM), a static RAM (SRAM), a flash memory, or a phase change RAM (PRAM).

The system 900 may be used in various portable electronic devices, such as mobile phones, MP3 players, navigation devices, solid state disks (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a multi-layer of dielectric layers on a semiconductor substrate, the multi-layer of dielectric layers including at least two metallic silicate layers having different silicon concentrations, which are a ratio of silicon atoms among all metal atoms and silicon atoms included in the metallic silicate layer; and
    after forming the multi-layer of dielectric layers, forming an upper electrode layer on the multi-layer of dielectric layers,
    wherein the multi-layer of dielectric layers is crystallized at a temperature at which the upper electrode layer is formed.

2. The method according to claim 1, wherein forming the multi-layer of dielectric layers comprises:
    forming a metal oxide layer on the semiconductor substrate; and
    forming a multi-layer of silicate layers on the metal oxide layer, the multi-layer of silicate layers including metal atoms and silicon atoms.

3. The method according to claim 2, wherein forming the multi-layer of silicate layers comprises:
    forming a first metallic silicate layer having a first silicon concentration; and
    forming a second metallic silicate layer having a second silicon concentration that is higher than the first silicon concentration.

4. The method according to claim 3, wherein the first metallic silicate layer and the second metallic silicate layer each comprise a hafnium-zirconium silicate.

5. The method according to claim 3, wherein forming the multi-layer of silicate layers comprises forming at least two first metallic silicate layers, and
    wherein the second metallic silicate layer is disposed between the at least two first metallic silicate layers.

6. The method according to claim 3, wherein forming the multi-layer of silicate layers comprises forming at least two second metallic silicate layers,
    wherein the first metallic silicate layer is disposed between the at least two second metallic silicate layers.

7. The method according to claim 3, wherein forming the multi-layer of silicate layers comprises forming the first metallic silicate layer to have a first thickness and forming the second metallic silicate layer to have a second thickness that is smaller than the first thickness.

8. The method according to claim 3, wherein forming the multi-layer of silicate layers comprises forming the first metallic silicate layer to have a first thickness and forming the second metallic silicate layer to have a second thickness, and
    wherein forming the metal oxide layer comprises forming the metal oxide layer to have a third thickness that is smaller than the first thickness, the second thickness and/or a sum of the first thickness and the second thickness.

9. The method according to claim 2, wherein in forming the upper electrode layer, the multi-layer of silicate layers is crystallized to have a cubic system, tetragonal system, or orthorhombic system crystalline structure.

10. The method according to claim 2, wherein forming the upper electrode layer comprises applying a process temperature that forms the upper electrode and that crystallizes the multi-layer of silicate layers to have a cubic system, tetragonal system, or orthorhombic system crystalline structure.

11. The method according to claim 10, wherein the process temperature crystallizes the metal oxide layer.

12. The method according to claim 2, wherein the metal oxide layer comprises a zirconium oxide, a hafnium oxide, and/or a hafnium-zirconium oxide.

13. The method according to claim 2, wherein the multi-layer of silicate layers comprises a hafnium silicate, a zirconium silicate, and/or a hafnium-zirconium silicate.

14. A method of manufacturing a semiconductor device, the method comprising:
    forming a metal oxide layer on a semiconductor substrate;
    forming a first hafnium-zirconium silicate layer on the metal oxide layer;
    forming a second hafnium-zirconium silicate layer having a higher silicon concentration than that of the first hafnium-zirconium silicate layer, on the first hafnium-zirconium silicate layer; and
    forming an upper electrode layer on the second hafnium-zirconium silicate layer,
    wherein the hafnium-zirconium oxide layer, the first hafnium-zirconium silicate layer, and the second hafnium-zirconium silicate layer are crystallized at a process temperature at which the upper electrode layer is formed.

15. The method according to claim 14, wherein the metal oxide layer includes a hafnium-zirconium oxide layer.

16. The method according to claim 14, wherein the process temperature is in a temperature range of about 400° C. to about 750° C.

17. The method according to claim 1, wherein the temperature at which the upper electrode layer is formed is in a temperature range of about 400° C. to about 750° C.

18. The method according to claim 1, wherein the multi-layer of silicate layers is crystallized while the upper electrode layer is formed.

* * * * *